United States Patent [19]

Luong

[11] Patent Number: 4,634,895
[45] Date of Patent: Jan. 6, 1987

[54] CMOS PEAK DETECTOR AND AC FILTER

[75] Inventor: Mark Y. F. Luong, Wyomissing, Pa.

[73] Assignee: AT&T Bell Laboratories, Murray Hill, N.J.

[21] Appl. No.: 629,811

[22] Filed: Jul. 11, 1984

[51] Int. Cl.$^4$ .................... G01R 19/02; G01R 19/22
[52] U.S. Cl. ................................ 307/350; 307/351; 307/353; 307/358; 307/261; 307/520
[58] Field of Search ............... 307/351, 352, 353, 358, 307/517, 261, 520, 350; 328/151

[56] References Cited

U.S. PATENT DOCUMENTS 3,921,010 11/1975 Griffin ................................ 307/351
4,209,717  6/1980 Mahony .............................. 307/353

OTHER PUBLICATIONS

D. W. Grimes, Maximum-Voltage Sensor and Storage, IBM Technical Disclosure Bulletin, vol. 19, No. 5, Oct., 1976, pp. 1552-1553.
*Designing With Operational Amplifiers* . . . , J. G. Graeme, McGraw-Hill Book Co., 1977, pp. 74-79.
"Data Acquisition Components", 1980 *IEEE ISSCC Digest of Technical Papers*, Feb. 1980, F. Gasparik, pp. 132-133.
"Integrated Bandsplit Filter System . . . ", *Microelectronics Journal*, vol. 11, No. 6, 1980, R. Gregorian et al, pp. 5-12.
*Operational Amplifier Characteristics and Applications*, R. G. Irvine, Prentice-Hall, Inc. 1981, pp. 142-144; 196-197.
*Op-Amps and Linear Integrated Circuit Technology*, R. A. Grayakwod, Prentice-Hall, Inc., pp. 380-383.

"Peak Hold Frequency Monitor", *New Electronics*, vol. 15, No. 3, P. Gladdish, p. 27, 2/9/82.

*Primary Examiner*—John Zazworsky
*Attorney, Agent, or Firm*—Wendy W. Koba

[57] ABSTRACT

The present invention relates to a CMOS peak detection circuit (10) which does not require a blocking diode as is used in conventional peak detection circuits. The detection circuit of the present invention comprises a comparator which functions to compare the current value of an AC input signal to a current peak value stored on a capacitor (16). The output of the comparator is connected to a NAND gate which in turn activates a CMOS transmission gate (12) disposed between the input signal line and the storage capacitor. When the current value of the input signal is greater than the current peak value stored on the capacitor, the CMOS transmission gate is turned on and the AC input signal is transferred to the storage capacitor. Alternatively, if the current value of the input signal is less than that stored on the capacitor, the NAND gate will not activate the CMOS transmission gate, and the input signal cannot pass to the capacitor. A negative peak detector can be formed merely by inverting the inputs to the comparator and resetting the storage capacitor to the positive power supply instead of the negative power supply. A tandem arrangement of a positive peak detector and a negative peak detector formed in accordance with the present invention may be utilized to determine the DC level of an AC input signal, since each detector will generate the peak positive and negative values of the input signal and the DC level is defined as the average value of these two peak values.

7 Claims, 8 Drawing Figures

FIG. 1

POSITIVE PEAK DETECTOR
10

FIG. 2

NEGATIVE PEAK DETECTOR
30

CMOS PEAK DETECTOR AND AC FILTER

BACKGROUND OF THE INVENTION

1. Field of the Invention

The present invention relates to a CMOS peak detector and AC filter and, more particularly, to a CMOS peak detector which utilizes a CMOS transmission gate as a blocking gate to eliminate the forward voltage drop associated with prior art arrangements. A positive peak detector and a negative peak detector may be used in tandem in accordance with the present invention to ascertain the DC component of a low frequency AC input signal.

2. Description of the Prior Art

Peak detectors are conventional components which have been used for many years in a variety of applications. Traditionally, a peak detector comprises an arrangement of diodes and operational amplifiers, interconnected to build a peak detector, as described in the book *Operational Amplifier Characteristics and Applications*, by Robert G. Irvine, Prentice-Hall, Inc., 1981 at pages 142-143. A conventional circuit follows the voltage peaks of a signal using an operational amplifier as a comparator and stores the highest value on a storage capacitor. If a higher peak signal value later occurs, this new value is stored on the capacitor. The capacitor can later be discharged to obtain the stored value. Negative peak detectors work in the same fashion, where the necessary inputs are reversed so that the capacitor retains the most negative occurring value. A problem associated with this arrangement is that a forward-biased diode is necessary between the input to the op amp and the storage capacitor to block the passage of any input voltage which is smaller than the peak voltage. This blocking diode, as it is referred to, necessarily creates a diode drop between the output of the op amp and the storage capacitor, resulting in a voltage less than the actual peak voltage passing into the capacitor.

An alternative peak detector arrangement which does not utilize a blocking diode is disclosed in U.S. Pat. No. 3,921,010 issued to R. T. Griffin on Nov. 18, 1975. The Griffin arrangement, however, is only capable of generating the positive (VDD) or negative (VSS) voltage supplies as an output, and is used primarily as an analog to digital converter, producing a "1" output for a positive peak and a "0" output for a negative peak. The Griffin arrangement, therefore, can not be used to determine the DC component of an AC input signal, since the DC level produced would always be the average value of the two power supplies, a zero-level DC signal.

The DC component of a low frequency, typically 60 Hz, AC signal is conventionally obtained in the prior art by utilizing large RC filter networks. Such networks require many stages to filter out low AC frequencies and cannot be formed in an integrated circuit, which is desirable in many applications.

A problem remaining in the prior art, then, is to provide a peak detector which does not exhibit a forward diode drop and which can be utilized as an AC filter to determine the DC component of low frequency AC input signal.

SUMMARY OF THE INVENTION

The problem remaining in the prior art has been solved in accordance with the present invention, which relates to a CMOS peak detector and AC filter and, more particularly, to a CMOS peak detector which utilizes a CMOS transmission gate as a blocking gate, thus eliminating the forward voltage drop associated with the prior art arrangements. A positive peak detector and a negative peak detector may be used in tandem in accordance with the present invention to ascertain the DC component of a low-frequency AC input signal.

It is an aspect of the present invention to provide a peak detector and AC filter which can be realized entirely of CMOS devices so that it may easily be integrated into a silicon circuit containing other necessary functions.

Another aspect of the present invention is to provide a low frequency AC filter, where the large RC filter networks of the prior art are replaced by a tandem arrangement of positive and negative peak detectors. The DC component of a low frequency AC input signal can then be determined by averaging the outputs of the positive and negative peak detectors.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views:

FIG. 8 is a timing diagram illustrating various signals used in association with the present invention.

DETAILED DESCRIPTION

Figure 1:
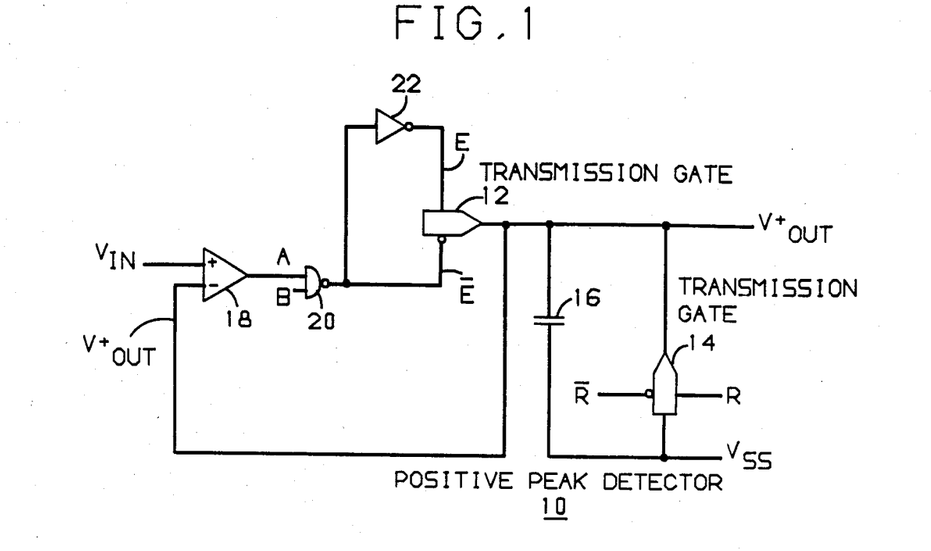
FIG. 1 illustrates a positive peak detector formed in accordance with the present invention.

A peak detector may be defined as a circuit which follows the voltage peaks of a given input signal and stores the highest value on a capacitor. If a higher peak signal value comes along during the same time interval, this higher value is stored. At the end of the time interval, the input signal is disconnected from the storage capcitor and the capacitor is discharged to ascertain the peak voltage during the time interval. The capacitor is then recharged to a predetermined level and the sequence is repeated to determine the next voltage peaks. A positive peak detector 10 formed in accordance with the present invention is illustrated in FIG. 1. Prior to the start of a positive peak detection cycle, the input signal must be disconnected from the storage capacitor and the capacitor reset to its most negative value. This is accomplished in accordance with the present invention by using a pair of CMOS transmission gates 12 and 14. CMOS transmission gate 12 is disposed between the input signal $V_{IN}$ and a storage capacitor 16. When a clock signal B goes low, CMOS transmission gate 12 will be turned off, disconnecting $V_{IN}$ from capacitor 16. CMOS transmission gate 14, as seen in FIG. 1, is connected between the negative power supply, VSS, and capacitor 16. During the reset phase, CMOS transmission gate 14 is turned on by a clock signal R going high, so that capacitor 16 is directly connected to the power supply and will be reset to the value VSS. At the end of the reset time interval, CMOS transmission gate 14 is turned off by clock signal R going low, disconnecting capacitor 16 from VSS and allowing capacitor 16 to charge to the peak voltage value. Clock signal B will go high at the end of the reset time interval, to allow the peak detection process, as explained below, to begin. FIG. 8 contains a timing diagram illustrating both clock signals R and B, as well as other clock signals which are utilized in other embodiments of the present invention.

To determine the positive peak voltage of a given AC signal $V_{IN}$, the signal $V_{IN}$ is first applied as a positive input to a comparator 18. The negative input to comparator 18, as seen by reference to FIG. 1, is the current value stored on capacitor 16, $V^+_{OUT}$. At the beginning of the detection cycle, $V^+_{OUT}$ will be equal to VSS, the most negative voltage supply. If $V_{IN}$ is greater than $V^+_{OUT}$, the output of comparator 18, denoted A, will be at logic level "1". Output signal A and clock signal B (which remains at logic level "1" during peak detection) are subsequently applied as separate inputs to a NAND gate 20. The output of NAND gate 20 is connected as a control input to CMOS transmission gate 12. Therefore, CMOS transmission gate 12 will be turned "on" and "off" as a function of the output of NAND gate 20. Here, since both A and B are equal to a logical "1", the output of NAND gate 20, denoted E, will be equal to a logical "0". $\overline{E}$ is applied as a first control signal input to CMOS transmission gate 12 and is also applied as an input to an inverter 22. The output of inverter 22, denoted E, is applied as the second control input to CMOS transmission gate 12. When control signal E is equal to a logical "1", CMOS transmission gate 12 is turned "on", and input signal $V_{IN}$ will pass through CMOS transmission gate 12 and charge capacitor 16 to the current value of $V^+_{OUT}$.

When the input signal $V_{IN}$ becomes less than the value stored on capacitor 16, that is when $V_{IN} < V^+_{OUT}$, the output of comparator 18 will be a logical "0". Since clock signal B is kept at a logical "1", and signal A is now at logical "0", the output of NAND gate 20, $\overline{E}$, will become a logical "1" and E will be a logical "0". Therefore, CMOS transmission gate 12 will be turned off, and capacitor 16 will maintain the value $V^+_{OUT}$, which is more positive than the current value of $V_{IN}$. Therefore, by turning CMOS transmission gate 12 "on" or "off" as a function of the relationship between $V_{IN}$ and $V^+_{OUT}$, capacitor 16 will sample and hodl the most positive value of input signal $V_{IN}$ which occurs during a specified time interval. At the end of the predetermined time interval, clock signal B becomes a logical "0", thus turning "off" transmission gate 12 and disconnecting capacitor 16 from the input signal. The current value stored on capacitor 16 is then recorded as the positive output peak $V^+_{OUT}$. As stated above, capacitor 16 is connected to VSS via CMOS transmission gate 14 at the end of the recording cycle to be completely discharged to VSS before beginning a new detection cycle. Positive peak detector 10 may also operate as a clocked comparator, where a CLK input is applied to comparator 18. Clock signal B must necessarily follow the CLK input to provide correct detection.

Figure 2:
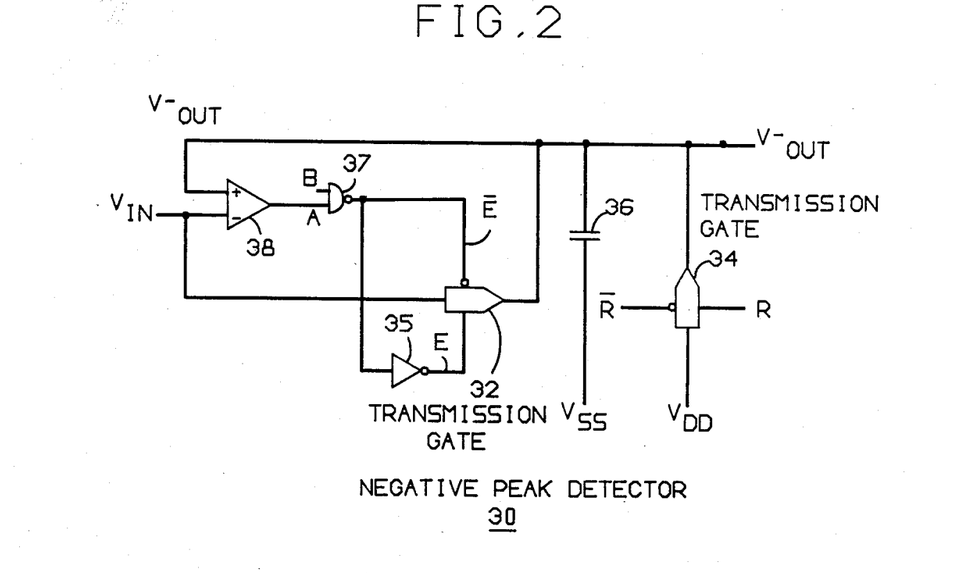
FIG. 2 illustrates a negative peak detector formed in accordance with the present invention.

A negative peak detector will comprise an arrangement similar to a positive peak detector, where the polarities of certain signals need to be inverted in order to detect a negative peak. An exemplary negative peak detector 30 is illustrated in FIG. 2. In a similar manner as described above in association with positive peak detector 10, negative peak detector 30 must go through a reset phase before detection can be initiated. Here, a pair of CMOS transmission gates 32 and 34 function to disconnect input signal $V_{IN}$ from a storage capacitor 36 and charge capacitor 36 to the positive voltage supply, VDD. In particular, clock signal B will go low during the reset phase, turning "off" CMOS transmission gate 32 and disconnecting $V_{IN}$ from capacitor 36. Clock signal R will go high, turning on CMOS transmission gate 34 and connecting capacitor 36 to VDD. At the end of the reset period, when capacitor 36 has been fully charged, clock signal B will go high and clock signal R will go low, allowing normal negative peak detection to occur.

As shown in FIG. 2, the same input signal $V_{IN}$, as discussed above in association with the positive peak detection scheme, is applied as a first input to a comparator 38. In order to provide negative peak detection, $V_{IN}$ is applied to the negative input terminal of comparator 38. The positive input to comparator 38 is the voltage $V^-_{OUT}$ stored on capacitor 36, where at the beginning of the detection cycle, $V^-_{OUT}$ is equal to the positive voltage supply VDD. If the current value of $V_{IN}$ is greater than the current value of $V^-_{OUT}$, the output of comparator 38, denoted A, will be a logical "0". As with positive peak detector 10, output signal A and clock signal B are supplied as separate inputs to a NAND gate 37. If A is equal to a logical "0", and B is maintained at a logical "1", the output of NAND gate 37, denoted E, will be a logical "1", and transmission gate 32 will remain "off". Alternatively, if the current value of input signal $V_{IN}$ is less than the current value of $V^-_{OUT}$, output signal A of comparator 38 will be a logical "1". Therefore, signal $\overline{E}$ will be a logical "0" and transmission gate 32 will be turned "on", allowing the voltage level of $V_{IN}$ to be transferred to capacitor 36. Therefore, the new value of $V^-_{OUT}$ will be equal to $V_{IN}$. Therefore, by turning transmission gate 32 "on" and "off" as a function of the relation between $V_{IN}$ and $V^-_{OUT}$, capacitor 36 will sample and hold the most negative voltage level of input signal $V_{IN}$. At the end of the sampling period, capacitor 36 is disconnected from the input signal and discharged to ascertain the most negative value. As with positive peak detector 10, negative peak detector 30 must cycle through another reset period before beginning another detection cycle, where capacitor 36 is again charged to the full positive potential VDD.

Figure 3:
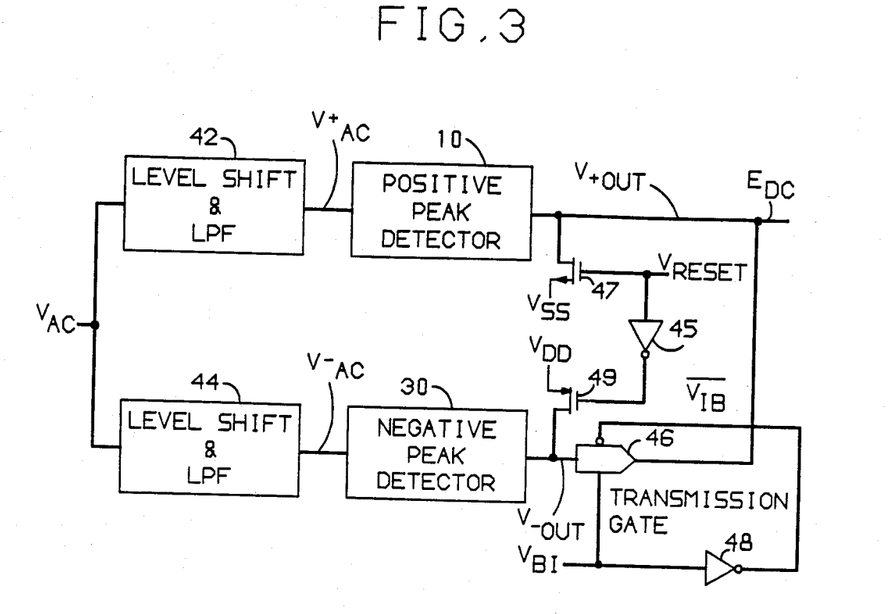
FIG. 3 illustrates an AC and DC converter which utilizes a tandem arrangement of the positive and negative peak detectors illustrated in FIGS. 1 and 2.

As stated above, a tandem arrangement of a positive peak detector and a negative peak detector may be utilized to determine the DC component of an AC input signal. A diagram of an exemplary tandem arrangement, referred to as a DC converter 40, is illustrated in FIG. 3. As shown, an AC input signal, denoted $V_{AC}$, is applied as an input to a first level shifter 42 and a second level shifter 44, where level shifter 42 moves input signal $V_{AC}$ to a desired voltage range commensurate with the dynamic range of positive peak detector 10. Similarly, level shifter 44 moves input signal $V_{AC}$ to a desired voltage range commensurate with the dynamic range of negative peak detector 30. Level shifters 42 and 44 also function to provide AC filtering of input signal $V_{AC}$ such that frequencies above, for example, 100 KHz are removed prior to entering either peak detector. The output from level shifter 42, denoted $V^+_{AC}$, is subsequently applied as an input to positive peak detector 10, and the output from level shifter 44, denoted $V^-_{AC}$, is applied as an input to negative peak detector 30.

As described above in association with FIGS. 1 and 2, positive and negative peak detectors 10 and 30 function to sample and hold the most positive and negative peak signals occurring during a predetermined time interval. At the end of the sampling period, positive peak detector 10 produces an output signal $V^+_{OUT}$ equal to the most positive signal value and negative peak detector 30 produces an output signal $V^-_{OUT}$ equal to the most negative signal value. The combination of the output signals from positive peak detector 10 and negative peak detector 30 are passed through to the output of DC converter 40 by the action of a transmission gate 46 and inverter 48. As shown in FIG. 3, a clocking input $V_{BI}$ is applied as a control input to transmission gate 46, and is also inverted through inverter 48 and applied as a second control input to transmission gate 46. Output signal $V^-_{OUT}$ from negative peak detector 30 is applied as the signal input to transmission gate 46. At the end of the sampling period, clock signal $V_{BI}$ will go "high", activating transmission gate 46, and allowing output signal $V^-_{OUT}$ to pass through transmission gate 46 and be combined with output signal $V^+_{OUT}$ from positive peak detector 10. The combination of $V^-_{OUT}$ and $V^+_{OUT}$, denoted $E_{DC}$, is defined as the DC component of AC input signal $V_{AC}$.

To restart the sample and hold cycle, clock signal $V_{BI}$ will go "lowE", disconnecting transmission gate 46 from the output of DC converter 40. Subsequently, a reset clock signal $V_{RESET}$ is activated to recharge storage capacitors 16 and 36 (not shown) located in peak detectors 10 and 30, to the supply voltages, VSS and VDD, respectively. As shown in FIG. 3, this recharging may be accomplished by activating a pair of MOS transistors 47 and 49, utilized in place of transmission gates 14 and 34 shown in FIGS. 1 and 2, which are coupled between the respective power supplies and detectors 10 and 30. In particular, the gate of N-channel 47 is activated by clock signal $V_{RESET}$, where the source of transistor 47 is coupled to the negative power supply VSS and the drain of transistor 47 is connected to capacitor 16 (not shown). Similarly, the gate of P-channel MOS transistor 49 is activated by the inverse of clock signal $V_{RESET}$, which passes through an inverter 45 before being applied to the gate input to transistor 49. The source of transistor 49 is coupled to the positive power supply VDD and the drain of transistor 49 is connected to capacitor 36 (not shown). Once capacitors 16 and 36 have been completely recharged, clock signal $V_{RESET}$ will go "low", and the next sample and hold cycle will begin. Both clock signals $V_{BI}$ and $V_{RESET}$ are illustrated in FIG. 8.

Figure 4:
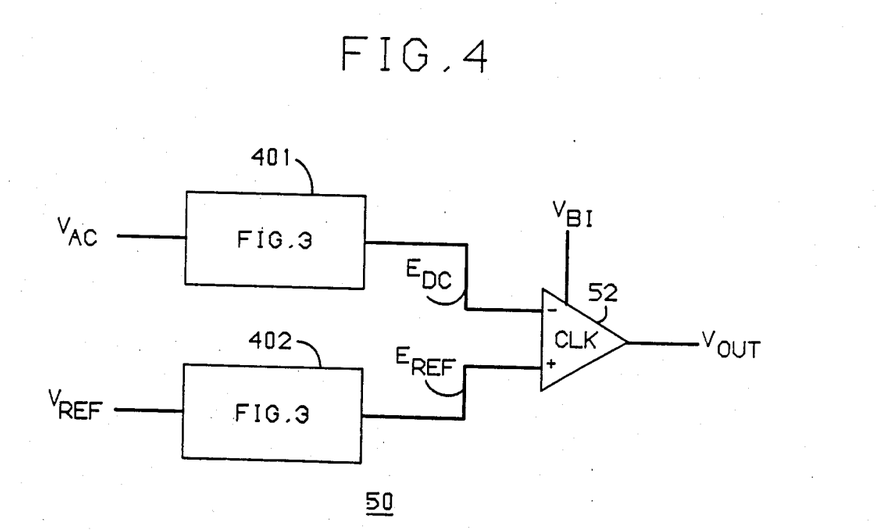
FIG. 4 illustrates a DC level detector which utilizes a tandem arrangement of AC to DC converters wherein one converter is responsive to an actual AC input signal and the other converter is responsive to a reference DC signal.

A DC level detector may also be implemented using the teachings of the present invention. One exemplary arrangement is illustrated in FIG. 4, which may be utilized to compare the DC level of an AC input signal to the DC level of a DC reference signal. In particular, an AC input signal $V_{AC}$ and a DC reference signal $V_{REF}$ are applied as separate inputs to a first DC converter 401 and a second DC converter 402, where converters 401 and 402 are formed as illustrated in FIG. 3. The output DC voltages from converters 401 and 402, denoted $E_{DC}$ and $E_{REF}$, respectively, are subsequently applied as inputs to a comparator 52. As shown, signal $E_{DC}$ is applied as the negative input and $E_{REF}$ is applied as the positive input. However, the polarities of these two input signals could be reversed without affecting the operation of the level detector. To ensure that the correct DC levels of both signals are being compared, comparator 52 operates as a clocked comparator and is controlled by clock signal $V_{BI}$, which as discussed above, is the clock signal which allows the transfer of the maximum positive and negative voltage levels to the output of detectors 10 and 30. In accordance with the operation of level detector 50, the output of comparator 52, denoted $V_{OUT}$, will be equal to a logical "0" if $E_{DC}$ is greater than $E_{REF}$, and $V_{OUT}$ will be equal to a logical "1" if $E_{DC}$ is less than $E_{REF}$.

In one application, DC level detector 50 may be used to detect the transitions of "on hook" and "off hook" on telephone subscriber lines. Conventionally, the "on" or "off" hook signal is a DC voltage. Due to various foreign voltages, low frequency induced AC voltages may be present along with the DC voltage. DC level detector 50 functions to screen out high frequency noise (via level shifters 42 and 44) and low frequency induced AC voltages (via positive and negative peak detectors 10 and 30). If the output of comparator 52 is equal to a logical "0" ($E_{DC} > E_{REF}$), an "off hook" determination is made. Conversely, if the output of comparator 52 is a logical "1" ($E_{DC} < E_{REF}$), an "on hook" determination is made.

Figure 5:
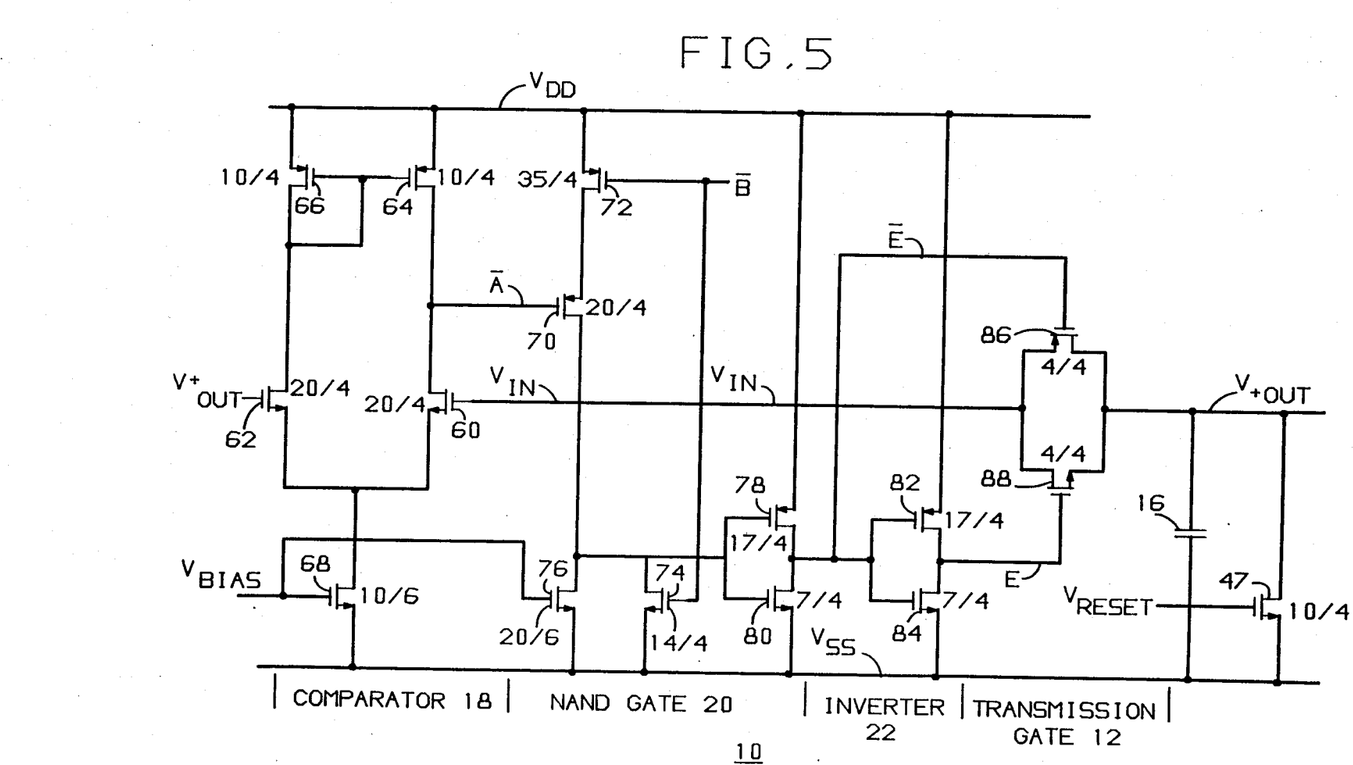
FIG. 5 is an exemplary CMOS implementation of the positive peak detector illustrated in FIG. 1.

A CMOS implementation of positive peak detector 10 is illustrated in detail in FIG. 5. As shown, comparator 18 comprises a plurality of MOS transistors 60-68. In particular, input signal $V_{IN}$ is applied to the gate of a first N-channel MOS transistor 60 and the current peak value, denoted $V^+_{OUT}$ is applied to the gate of a second N-channel MOS transistor 62. The drain of transistor 60 is connected to the drain of a P-channel transistor 64 and the drain of transistor 62 is connected to the drain of a P-channel transistor 66. The gates of transistors 64 and 66 are coupled together and connected to the drain of transistor 66. The sources of transistors 64 and 66 are also connected together and coupled to the positive power supply VDD. As connected, transistors 64 and 66 form a current mirror to ensure that the currents flowing through transistors 60 and 62 are sufficiently identical to allow accurate comparing between signals $V_{IN}$ and $V^+_{OUT}$. An additional N-channel MOS transistor 68 is connected between the sources of transistors 60 and 62 and the negative power supply VSS, the gate of transistor 68 being activated by a $V_{BIAS}$ input, where $V_{BIAS}$ is the bias voltage necessary for the current source formed by transistors 64 and 66. In accordance with this particular implementation of the present invention, the inverse of the output of comparator 18, denoted $\overline{A}$, appears at the interconnection of the drain of transistor 64 and the drain of transistor 60. The use of the value $\overline{A}$ in place of A is explained below. It is to be noted that the channel constant, Z/L, for each transistor is included in the illustration of FIG. 5, as well as in the following illustrations, where these channel constants are exemplary only, and serve to provide a complete disclosure of the present invention.

As previously described in association with FIG. 1, output signal A is subsequently applied as a first input to NAND gate 20, where as shown in FIG. 5, NAND gate 20 comprises a plurality of MOS transistors 70–80. In this particular CMOS configuration, the NAND operation is performed by "OR"ing the inverted values of A and B since $\overline{A} + \overline{B} = \overline{A \cdot B}$. Referring to FIG. 5, output signal $\overline{A}$ is applied as the gate input to a first P-channel MOS transistor 70. The source of transistor 70 is connected to the drain of a second P-channel transistor 72, where the source of transistor 72 is connected to VDD. The gate of transistor 72, as illustrated in FIG. 5, is activated by clock signal $\overline{B}$ (where $\overline{B}$ must be used in place of B to provide the correct NAND output, as explained above). Clock signal $\overline{B}$ is also applied as the gate input to an N-channel transistor 74, where the drain of transistor 70 is connected to the drain of transistor 74. The drain of transistor 70 is also connected to the drain of an N-channel transistor 76, which is activated at its gate by the signal $V_{BIAS}$. The sources of transistors 74 and 76 are coupled together and connected to VSS, as shown in FIG. 5. In order to provide the NAND output of E, a pair of matched P- and N-channel transistors 78 and 80 are connected so as to form an inverter between VDD and VSS, as shown in FIG. 5. The gates of transistors 78 and 80 are connected together and coupled to the drains of transistors 74 and 76. As shown, the drain of transistor 78 is connected to the drain of transistor 80, where in accordance with the present invention, the output of NAND gate 20, denoted $\overline{E}$, will exist at this interconnection. The signal E is also needed as an input to transmission gate 12, as shown in FIG. 1, and is formed by applying the signal $\overline{E}$ as an input to a second inverter, formed by a matched pair of P- and N-channel transistors 82 and 84 disposed in a manner similar to transistors 78 and 80. Therefore, the signal E will appear as an output at the interconnection of the drain of transistor 82 and the drain of transistor 84.

As illustrated in FIG. 1, the signals E and $\overline{E}$ are the inputs controlling the operation of CMOS transmission gate 12. CMOS transmission gate 12 may be realized, as shown in FIG. 5, by a pair of MOS transistors 86 and 88. In particular, a P-channel transistor 86 is activated at its gate by the signal $\overline{E}$, where the source of transistor 86 is connected to input signal $V_{IN}$ and the drain of transistor 86 is connected to capacitor 16. Similarly, the gate of N-channel MOS transistor 88 is activated by the signal E and the drain of transistor 88 is also connected to input signal $V_{IN}$. The source of transistor 88 is connected with the drain of transistor 86 to capacitor 16. Therefore, in accordance with the present invention, when the signal E is a logical "1" and $\overline{E}$ is a logical "0", transistor 88 and 86 will be turned "on", connecting the signal $V_{IN}$ with capacitor 16. Otherwise, transistors 86 and 88 will remain "off", isolating the input signal from the storage capacitor. At the end of the sample and hold cycle, as discussed above, capacitor 16 is isolated from the input signal (by forcing clock signal B to go "low" which forces signal E to remain a logical "0"), and is discharged to determine the positive peak signal. Capacitor 16 is subsequently reset to the negative supply voltage VSS by the activation of N-channel MOS transistor 47, as discussed hereinabove in association with FIG. 3. The gate of transistor 47 is activated by clock reset signal $V_{RESET}$. Therefore, when transistor 47 is turned "on", the negative power supply will be connected to capacitor 16, allowing capacitor 16 to fully discharge to the value VSS.

Figure 6:
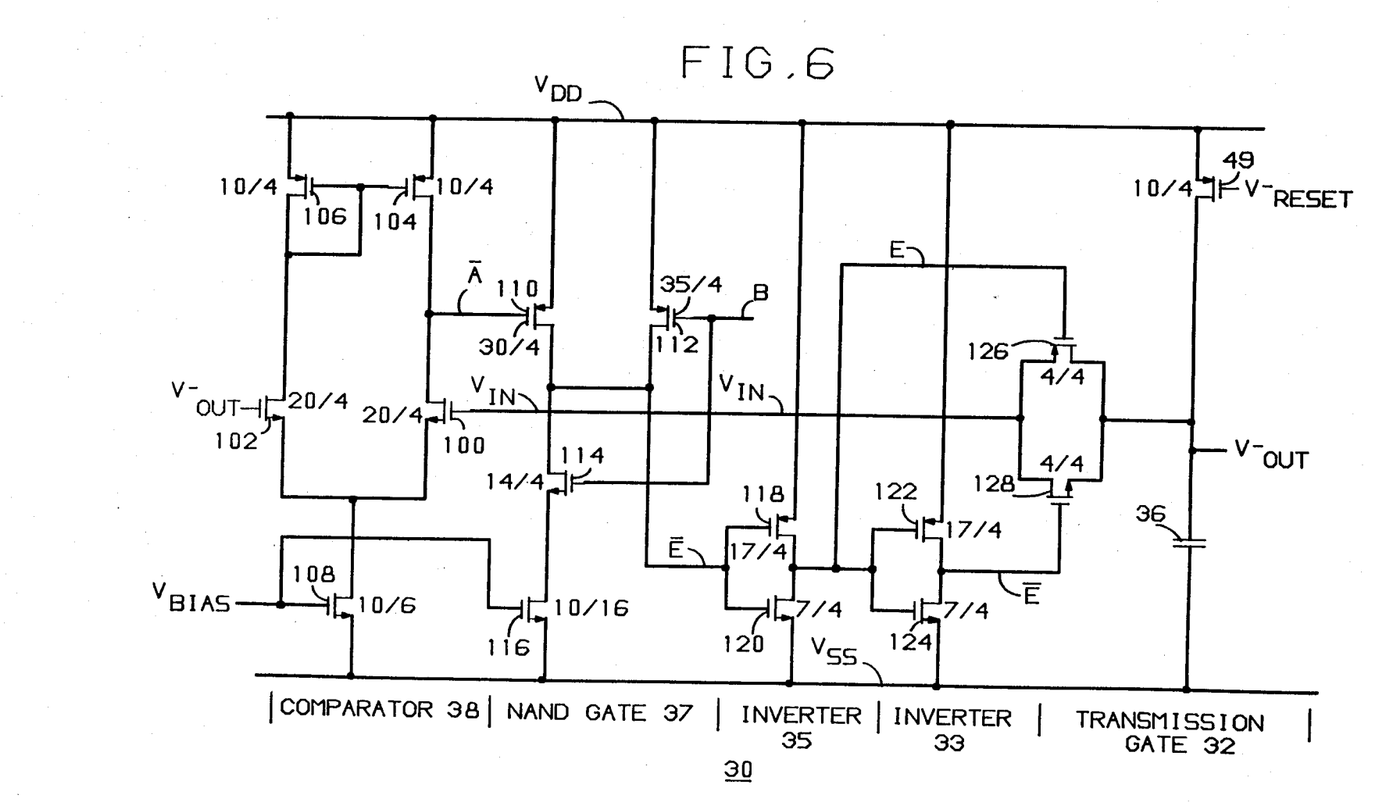
FIG. 6 is an exemplary CMOS implementation of the negative peak detector illustrated in FIG. 2.

A CMOS implementation of negative peak detector 30 is illustrated in detail in FIG. 6, where the specific implementation of negative peak detector 30 is slightly different than the CMOS implementation of positive peak detector 10 illustrated in FIG. 5. As shown, input signal $V_{IN}$ is applied to the gate of a first N-channel MOS transistor 100 and the current negative peak value, denoted $V^-_{OUT}$, is applied to the gate of a second N-channel transistor 102. The drain of transistor 100 is connected to the drain of a P-channel transistor 104 and the drain of transistor 102 is connected to the drain of a P-channel transistor 106. The gates of transistors 104 and 106 are coupled together and connected to the drain of transistor 106. The sources of transistors 104 and 106 are also connected together and coupled to the positive power supply VDD. As connected, transistors 104 and 106 form a current mirror to ensure that the currents flowing through transistors 100 and 102 are sufficiently identical to allow accurate comparing between signals $V_{IN}$ and $V^-_{OUT}$. An additional N-channel MOS transistor 108 is connected between the sources of transistors 100 and 102 and the negative power supply VSS, where the gate of transistor 108 is activated by a $V_{BIAS}$ input, where $V_{BIAS}$ is the bias voltage necessary for the current source formed by transistors 104 and 106. Up to this poiont, the CMOS implementation of negative peak detector 30 is identical to the implementation of positive peak detector 10.

In accordance with the present invention, the signal $\overline{A}$ will appear at the interconnection of the drain of transistor 104 and the drain of transistor 100. The signals $\overline{A}$ and B are utilized in accordance with the present implementation of negative peak detector 30. As previously described in association with FIG. 2, output signal $\overline{A}$ from comparator 38 is subsequently applied as a first input to NAND gate 37, where in the CMOS implementation illustrated in FIG. 6, NAND gate 37 comprises a plurality of MOS transistors 110–116. In particular, output signal $\overline{A}$ is applied as the gate input to a first P-channel transistor 110. The source of transistor 110 is connected to the source of a second P-channel transistor 112, where both sources are coupled to VDD. Similarly, the drains of transistors 110 and 112 are connected together and are coupled to the drain of an N-channel transistor 114, where the output of NAND gate 37, denoted $\overline{E}$, will exist at this interconnection. The gate of transistor 114 is connected to the gate of transistor 112. Both gate inputs are activated by clock signal B. The source of transistor 114 is subsequently connected to the drain of a second N-channel transistor 116, where the source of transistor 116 is coupled to VSS. As seen by reference to FIG. 6, the gate of transistor 116 is activated by the same $V_{BIAS}$ signal that activates transistor 108. Note that $V_{IN}$ is connected to the positive input of comparator 38, as shown in FIG. 6, instead of being connected to the negative input of comparator 38, as shown in FIG. 2. In order to compensate for this reversal, the output of comparator 38, $\overline{A}$, is not inverted when applied as an input to NAND gate 37.

In accordance with the illustration of negative peak detector 30 in FIG. 2, signal $\overline{E}$ is subsequently applied as an input to an inverter 35, where in this CMOS implementation, inverter 35 is formed by connecting a matched pair of P- and N-channel transistors 118 and 120 between VDD and VSS. The gates of transistors 118 and 120 are connected together and coupled to the drain of transistors 110 and 112, denoted $\overline{E}$. Therefore, the signal E will appear as an output of inverter 35 at the interconnection of the drain of transistors 118 and the drain of transistor 120. In accordance with the present invention, the signals $\overline{E}$ and E are the inputs controlling the operation of CMOS transmission gate 32. In order to enhance the logic signal, an inverter 33 is added (not shown in FIG. 2). Inverter 33 is formed by a matched pair of P- and N- channel transistors 122 and 124, respectively, disposed in a manner similar to transistors 118 and 120. Therefore, the signal $\overline{E}$ will appear again as an output at the interconnection of the drains of transistors 122 and 124.

CMOS transmission gate 32 may be realized, as shown in FIG. 6, by a pair of MOS transistors 126 and 128. In particular, an N-channel transistor 126 is activated at its gate by the signal E, where the drain of transistor 126 is connected to input signal $V_{IN}$ and the source of transistor 126 is connected to capacitor 36. Similarly, the gate of P-channel transistor 128 is activated by the signal $\overline{E}$ and the source of transistor 128 is also connected to the input signal $V_{IN}$. The drain of transistor 128 is connected with the source of transistor 126 to capacitor 36.

Therefore, in accordance with the present invention, where the signal $\overline{E}$ is a logical "0" and E is a logical "1", transistors 128 and 126 will be turned "on", connecting the signal $V_{IN}$ with capacitor 36. Otherwise, transistors 126 and 128 will remain "off", isolating the input signal from the storage capacitor. At the end of the sample and hold cycle, as discussed above, capacitor 36 is isolated from the input signal (by forcing clock signal B to go "low" which forces signal E to remain a logical "0"), and is discharged to determine the most negative peak value. Capacitor 36 is subsequently reset to the positive supply voltage VDD by the activation of P-channel MOS transistor 49 as shown in FIG. 6.

Figure 7:
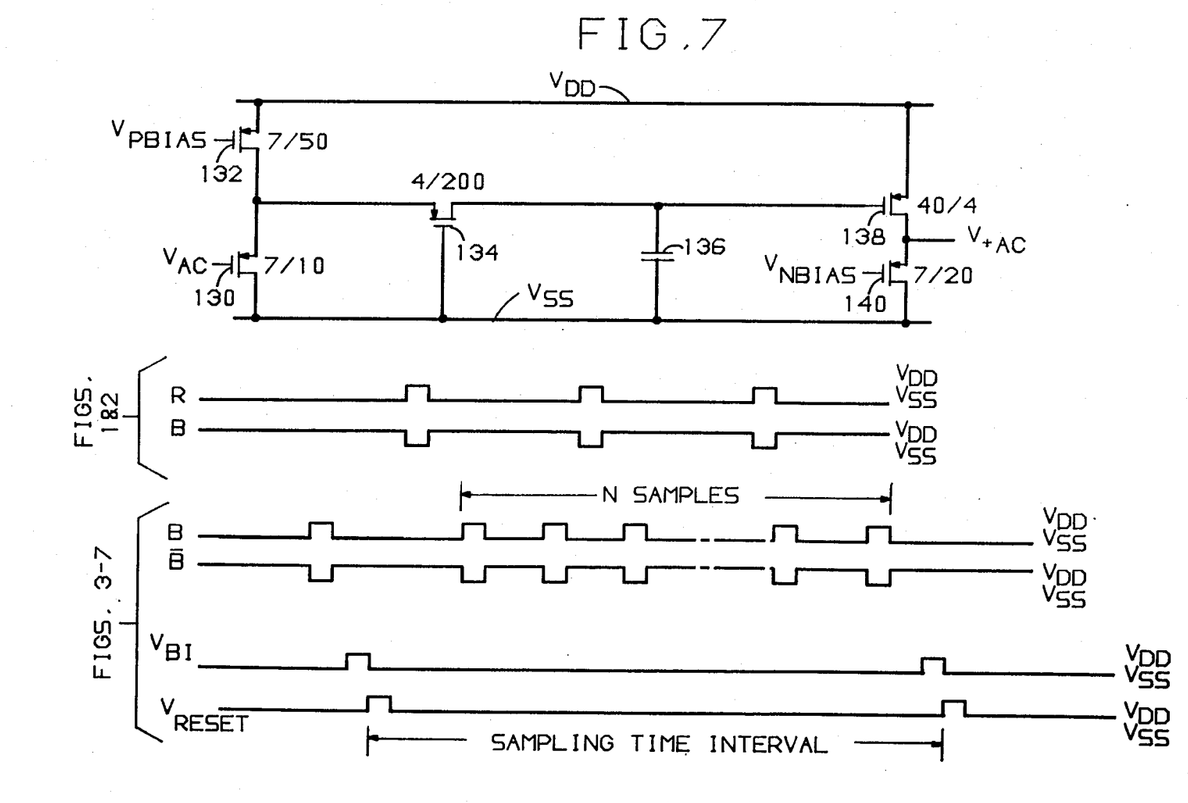
FIG. 7 is an exemplary CMOS implementation of a portion of the AC to DC converter illustrated in FIG. 3 which performs level shifting and low pass filtering.

An examplary CMOS implementation of level shifter 42 is illustrated in FIG. 7. As shown, input signal $V_{AC}$ is applied as the gate input to a first P-channel MOS transistor 130, where the drain of transistor 130 is connected to VSS. A second P-channel MOS transistor 132 is connected in series between transistor 130 and VDD, where the gate of transistor 132 is connected to a bias voltage $V_{PBIAS}$ for a P-channel source-follower. From this source-follower structure, input signal $V_{AC}$ will be shifted by a positive amount. A P-channel MOS transistor 134 is connected to the source/drain interconnection of transistors 130 and 132, where the gate of transistor 134 is connected to VSS. The drain of transistor 134 is connected to a capacitor 136, where both the value of capacitor 136 and the size of transistor 134 determine the cutoff frequency of level shifter 42. Capacitor 136 is also connected to the gate of a N-channel transistor 138, where the drain of transistor 138 is connected to VDD. The source of transistor 138 is connected to the drain of an N-channel transistor 140, where the source of transistor 140 is connected to VSS and the gate of transistor 140 is activated by a bias voltage $V_{NBIAS}$ for a N-channel source follower. The source-follower structure of transistors 138 and 140 functions to shift the voltage by a negative amount, where the combined positive and negative shifts will bring input signal $V_{AC}$ into the dynamic range of positive peak detector 10, thus producing as an output the signal $V^+_{AC}$. The same circuit is utilized in association with negative peak detector 30, to provide an output signal $V^-_{AC}$ which is within the dynamic range of negative peak detector 30.

What is claimed is:

1. A circuit for detecting the DC voltage level of an AC input signal, the circuit comprising positive peak detectionmeans for determining a peak positive value of the AC input signal;
negative peak detection means for determining a peak negative value of said AC input signal;
means for averaging the peak positive value and the peak negative value of said AC input signal to form the DC voltage level, the averaging means including a CMOS transmission gate disposed between the output of the positive peak detection means and the negative peak detection means, said transmission gate responsive to both the negative peak detection means and an external clock source for coupling together the outputs of said negative peak detection means and the positive peak detection means in response to a predetermined clock signal from said external clock source.

2. A detection circuit as defined in claim 1 wherein the positive peak detection means comprises storage means for monitoring and storing a current positive peak voltage level;
a comparator responsive to both the AC input signal and the current peak voltage level for comparing said AC input signal and said current peak voltage level and generating a first output when said AC input signal is greater than said current peak voltage level and generating a second output when said AC input signal is less than or equal to said current peak voltage level; and
CMOS control means disposed in a signal path between said AC inut signal and said storage means and responsive to the output of the comparator for connecting said AC input signal to said storage means when said comparator produces the first output signal and disconnecting said AC input signal from said storage means when said comparator produces the second output signal; and the negative peak detection means comprises
storage means for monitoring and storing a current negative peak voltage level;
a comparator responsive to both said AC input signal and the current negative peak voltage level for comparing said AC input signal and said current negative peak voltage level and generating a first output when said AC input signal is less than said current negative peak voltage level and generating a second output when said AC input signal is greater than or equal to said current negative peak voltage level; and
CMOS control means disposed in a signal path between said AC input signal and said negative peak storage means and responsive to the output of the comparator for connecting said AC input signal to said negative peak storage means when said negative comparator produces the first output signal and disconnecting said AC input signal from said negative peak storage means when said negative comparator produces the second output signal.

3. A detection circuit as defined in claim 2 wherein the positive peak detection storage means comprises a capacitor connected between the CMOS control means and a negative power supply and the negative peak detection storage means comprises a capacitor connected between the CMOS control means and said negative power supply.

4. A detection circuit as defined in claim 2 wherein the positive peak detection CMOS control means comprises logic means responsive to the output of the comparator for generating a first logic signal when the comparator generates its first output signal and generating a second logic signal when the comparator generates its second output signal; and a CMOS transmission gate disposed in the signal path between the input voltage signal and the storage means and responsive to the output signal generated by the logic means for connecting said input voltage signal to said storage means when the logic means generates its first output signal and disconnecting said input voltage signal from said storage means when the logic means generates its second output signal.

5. A detection circuit as defined in claim 4 wherein the logic means comprises a NAND gate responsive to both the output of the comparator and a reference signal wherein the reference signal maintains a logical "1" value such that the NAND gate produces a logical "0" as the first logic signal output and a logical "1" as the second logic signal output of said logic means.

6. A detection circuit as defined in claim 2 wherein the negative peak detection CMOS control means comprises logic means responsive to the output of the comparator for generating a first logic signal when the comparator generates its first output signal and generating a second logic signal when the comparator generates it second output signal; and a CMOS transmission gate disposed in the signal path between the input voltage signal and the storage means and responsive to the output signal generated by the logic means for connecting said input voltage signal to said storage means when the logic means generates its first output signal and disconnecting said input voltage signal from said storage means when the logic means generates its second output signal.

7. A detection circuit as defined in claim 6 wherein the logic means comprises a NAND gate responsive to both the output of the comparator and a reference signal wherein the reference signal maintains a logical "1" value such that the NAND gate produces a logical "0" as the first logic signal output and a logical "1" as the second logic signal output of said logic means.

* * * * *

UNITED STATES PATENT AND TRADEMARK OFFICE
CERTIFICATE OF CORRECTION

PATENT NO. : 4,634,895

DATED : January 6, 1987

INVENTOR(S) : Mark Y. F. Luong

It is certified that error appears in the above-identified patent and that said Letters Patent is hereby corrected as shown below:

Column 3, line 36, "E" should read --$\overline{E}$--.

Column 3, line 57, "hodl" should read --hold--.

Column 4, line 36, "supplied" should read --applied--.

Column 4, line 39, "E" should read --$\overline{E}$--.

Column 5, line 37, "lowE" should read --low--.

Column 7, line 21, "E" should read --$\overline{E}$--.

Column 8, line 24, "poiont" should read --point--.

Signed and Sealed this

Twenty-eighth Day of April, 1987

Attest:

DONALD J. QUIGG

*Attesting Officer*    *Commissioner of Patents and Trademarks*